United States Patent [19]
Erdelyi et al.

[11] Patent Number: 5,059,837
[45] Date of Patent: Oct. 22, 1991

[54] DATA DEPENDENT VARIABLE TIME DELAY CIRCUIT

[75] Inventors: Charles K. Erdelyi; Mark G. Marshall, both of Essex Junction, Vt.

[73] Assignee: IBM, Armonk, N.Y.

[21] Appl. No.: 309,530

[22] Filed: Feb. 13, 1989

[51] Int. Cl.$^5$ .................. H03K 5/13; H03K 5/159; H03K 17/28

[52] U.S. Cl. .................. 307/601; 307/602; 307/263; 307/268; 307/450; 307/603; 307/605

[58] Field of Search .............. 307/443, 448, 449, 450, 307/601, 602, 603, 605, 606, 464, 363, 263, 268, 246, 594–595

[56] References Cited

U.S. PATENT DOCUMENTS

| | | | |
|---|---|---|---|
| 2,964,708 | 12/1960 | Steele | 307/269 |
| 3,102,208 | 8/1963 | Reache Jr. | 307/595 |
| 3,346,746 | 10/1967 | Gordon . | |
| 3,558,924 | 1/1971 | Lindell | 307/260 |
| 3,675,133 | 7/1982 | Frankeny et al. | 307/265 |
| 3,753,012 | 8/1973 | Frederiksen et al. | 307/268 |
| 4,140,927 | 2/1979 | Feucht | 307/265 |
| 4,399,372 | 8/1983 | Tanimoto et al. | 307/449 |
| 4,423,339 | 12/1983 | Seelbach et al. | 307/464 |
| 4,424,456 | 1/1984 | Shiraki et al. | 307/268 |
| 4,587,441 | 5/1986 | Torelli et al. | 307/269 |
| 4,638,188 | 1/1987 | Cray | 307/263 |
| 4,641,046 | 2/1987 | Becker et al. | 307/568 |
| 4,896,059 | 1/1990 | Goodwin-Johansson | 307/464 |

FOREIGN PATENT DOCUMENTS

| | | |
|---|---|---|
| 57-131126 | 3/1982 | Japan . |
| 57-99029 | 6/1982 | Japan . |
| 60-33732 | 2/1985 | Japan . |
| 61-52022 | 3/1986 | Japan . |
| 2086681 | 5/1982 | United Kingdom . |
| 8808642 | 11/1988 | World Int. Prop. O. .......... 328/55 |

OTHER PUBLICATIONS

European Search Report.
IBM Technical Disclosure Bulletin (vol. 31, No. 1, Jun. 1988) pp. 21–23, "Device Parameter Independent Delay Circuit".

*Primary Examiner*—Timothy P. Callahan
*Attorney, Agent, or Firm*—Sughrue, Mion, Zinn, Macpeak & Seas

[57] ABSTRACT

A delay circuit for receiving a number of input signals and for providing a delay in accordance with the input signals. The delay circuit includes: an output circuit for producing a first output signal when a node is above a threshold voltage, and for producing a second output signal, which is different from the first output signal, when the node is below the threshold voltage; a device for maintaining the node voltage at a level which is above the threshold voltage so that the output circuit produces the first output signal; and a plurality of switching devices for causing, the node voltage to decrease below the threshold voltage so that the output circuit produces the second output signal. Depending on which one of the switching devices is rendered conductive, the node voltage will decrease at a different rate, thereby causing the output circuit to produce the second output signal at different delay times.

11 Claims, 3 Drawing Sheets

DATA DEPENDENT VARIABLE TIME DELAY CIRCUIT

FIELD OF THE INVENTION

The present invention generally relates to a delay circuit, and more particularly, to a delay circuit whose time delay is varied depending upon received data.

BACKGROUND OF THE INVENTION

Delay and related circuits are generally known in the art. Examples of such circuits are as follows:

Japanese Pat. No. 60-33732 discloses a delay circuit whose delay time is stable against power supply variations and temperature fluctuations. This circuit varies an injector current from a constant current supply (an operational amplifier) to obtain changes in the delay time of the circuit.

U.S. Pat. No. 3,346,746 discloses a monostable multivibrator triggered by an OR-gate which receives a plurality of inputs. In addition, the pulse time of the multivibrator is in part controlled by a variable timing network in response to the particular input which input triggered the multivibrator.

U.S. Pat. No. 3,753,012 discloses a time delay generator which provides a plurality of precise time delays following a trigger action.

U.S. Pat. No. 3,675,133 discloses an apparatus for independently varying, by preselected amounts, the position of pulse edges by the use of a plurality of variable delay means.

U.S. Pat. No. 3,558,924 discloses a circuit having a plurality of input signals with corresponding time-delayed independent output signals.

Other references which are related to the general field of delay circuits are: U.S. Pat. Nos. 2,964,708, 3,102,208, 4,140,927, 4,587,441 and 4,638,188, and Japanese Patent Nos. 57-99029 and 57-131126.

In designing delay circuits, it is important that the delay characteristics of the circuit be as accurate a possible.

Further, it is necessary to consider process tolerances, temperature differentials and changes in the power supply of the delay circuit, all of which are factors in the reliability or accuracy of a delay circuit.

SUMMARY OF THE INVENTION

It is an object of the present invention to provide a delay circuit whose time delay varies depending upon received data.

It is another object of the present invention to provide an extremely accurate delay circuit.

It is another object of the present invention to provide a delay circuit whose accuracy is unaffected by changes in process tolerances, temperature and power supply.

The present invention accomplishes these and other objects by providing a delay circuit comprising output means having its input coupled to a node for producing a first output signal when the voltage at the node is greater than or equal to a predetermined threshold voltage, and for producing a second output signal, which is different from the first output signal, when the voltage at the node is less than the predetermined voltage;

means for maintaining the voltage at the node greater than the predetermined voltage, thereby causing the output means to produce the first output signal; and a plurality of switching means, each of the switching means being connected to the node and being connected to receive a different one of a plurality of input signals such that the node voltage decreases to a voltage which is less than the predetermined voltage when any one of the plurality switching means is rendered conductive by a corresponding input signal, thereby causing the output means to produce the second output signal; and wherein at least one of the plurality of switching means is constructed such that, when the one switching means is rendered conductive, the rate at which the node voltage decreases to a voltage below the predetermined threshold voltage is different from the rate at which the node voltage decreases to a voltage below the threshold voltage when any of the other switching means is rendered conductive.

DESCRIPTION OF THE PREFERRED EMBODIMENTS

Figure 1:
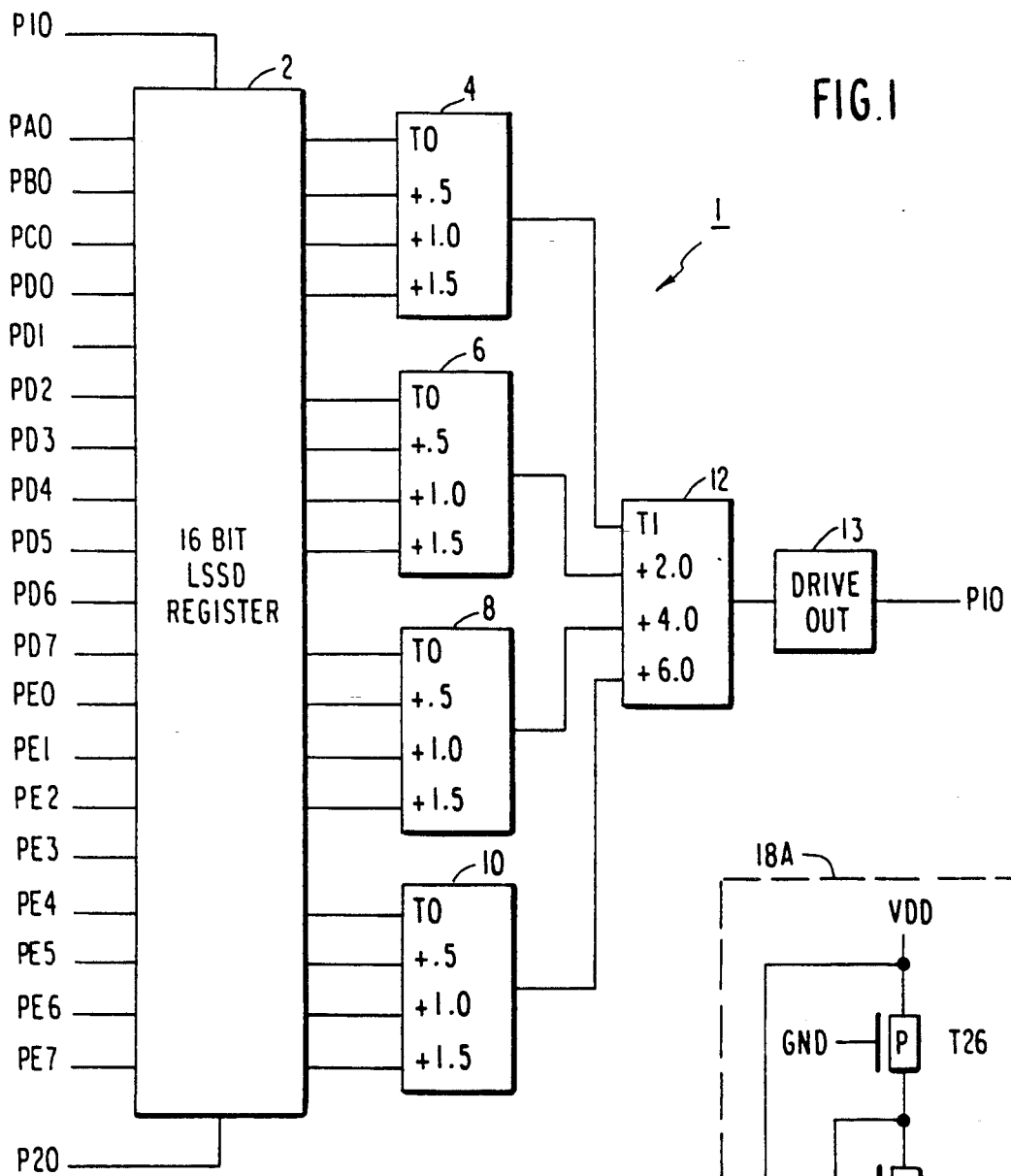
FIG. 1 is a general block diagram of the present invention.

FIG. 1 shows a general block diagram of the delay circuit 1 according to the present invention. The delay circuit includes a 16-bit LSSD register 2, four "first level" functional OR-gates 4, 6, 8 and 10, a single "second level" functional OR-gate 12 and a drive-out circuit 13.

The 16-bit LSSD register 2 is generally known to those skilled in the art. In general, register 2 functions to receive sixteen binary input signals and to simultaneously output these sixteen binary signals after they propagate through the master-slave network contained in the register. In FIG. 1, the sixteen input signals PA0, PB0, PC0, PD0, PD2-PD5, PD7, PE0-PE2 and PE4-PE7 are supplied to register 2. The sixteen (16) input signals propagate through the register (i.e., through the master-slave network of the register) in response to clocking signals PD1 and PD6. These sixteen signals are then simultaneously outputted from the register 2. The register 2 further receives a serial-in signal P10, a serial-out signal P20 and a shift register clock PE3. As is known, these signals are used during the testing of the register 2.

Each of the first four level functional OR-gates 4, 6, 8 and 10 receives four of the output signals from register 2, as shown in FIG. 1. For example, gate 4 receives signals PA0, PB0, PC0 and PD0 from register 2. Each of these first-level functional OR-gates includes terminals designated as T0, +0.5, +1.0 and +1.5. Each of these terminals receives a different one of the output signals from register 2. In FIG. 1, terminals T0, +0.5, +1.0 and +1.5 receive signals PA0, PB0, PC0 and PD0, respectively. Each of the first level gates 4, 6, 8 and 10 functions like a conventional OR-gate in that, when any one of the inputs to these gates is a "1", then the outputs of these gates will also be a "1". Accordingly, these functional OR-gates will produce a "0" output only when all of the input signals to these gates are "0". However, these functional OR-gates are different from conventional OR-gates in that all of the input signals are not propagated through a gate at the same rate. More particularly, an input signal supplied to terminal T0 will propagate through the gate in T0 nanoseconds, whereas a signal supplied to input terminal +0.5 will propagate through the gate in TO +0.5 nanoseconds. Similarly, input signals supplied to terminals +1.0 and +1.5 will propagate through the gate in T0 +1.0 nanoseconds and T0 +1.5 nanoseconds seconds, respectively. The value TO may represent, for example 0.5 nanoseconds, 3ns, etc. Its value is not critical.

The single second level functional OR-gate 12, which receives the four output signals from gates 4, 6, 8 and 10, respectively, is identical to each of the first level functional OR-gates, except that this single gate includes terminals designated as T1, +2.0 and +4.0 and +6.0. Thus, the output signal from gate 4 will propagate through gate 12 in T1 nanoseconds, whereas the output from gate 10 will propagate through gate 12 in T1 +6.0 nanoseconds. The value of T1 may be, for example 5ns or 11ns, it is not critical.

The drive out circuit 13 receives the output from gate 12, and it functions as a driver.

At this point, it should be noted that the data (i.e., the sixteen different input signals) supplied to the register 2 in any given cycle can take one of two different forms, namely a DATA cycle or a RESET cycle. More particularly, in the RESET cycle, the signals supplied to register 2 are all "0's" (i.e., all sixteen inputs signals are equal to "0"). In the DATA cycle, one of the input signals is a "1", and the remaining fifteen signals are all "0". Typically, there cannot be two consecutive DATA cycles (i.e., RESET cycles generally must precede and follow a DATA cycle). RESET causes the output of the delay circuit to be reset to a given value. For three consecutive cycles of data A, B and C supplied to register 2, if cycle B is a DATA cycle cycles A and C are both RESET cycles. However, as discussed in more detail below, under special timing and pattern conditions the reset cycle may not be required.

From the foregoing, it is apparent that, depending on which one of the sixteen input signals to register 2 contains a "1", a different time delay will be produced before that input signal ("1") is supplied to the drive-out circuit 13. For example, if PA0 equals to "1", and each of the remaining fifteen inputs to register 2 is equal to a "0", then a "1" input would be supplied to the drive out circuit 13 via gates 4 and 10 in time (T0) + (T1). This would represent the shortest delay or propagation time through the circuit of FIG. 1. On the other hand, if PE7 equals "1", and each remaining fifteen (15) input signals to register 2 is equal to a "0", then a "1" would be supplied to drive out circuit 13 via gates 10 and 12 in time (T0 + 1.5) + (T1 + 6.0), the longest delay or propagation time through the circuit.

It should be noted that, although all of the first level gates 4, 6, 8 and 10 are identical to each other, the invention is not so limited. In particular, one or more of the first level gates 4, 6, 8 and 10 may be different from the other gates in terms of their delay characteristics. For example, gates 6, 8 and 10 may be as shown in FIG. 1, while gate 4 may have four terminals causing delays of T0, T0 + 2.5, T0 + 1.0 and T0 + 2.0, respectively. Thus, not only can one or more of the functional OR gates of FIG. 1 be different from the other gates in terms of delay characteristics, but also the different delay characteristics associated with a given gate do not have to be multiples of each other.

Figure 2:
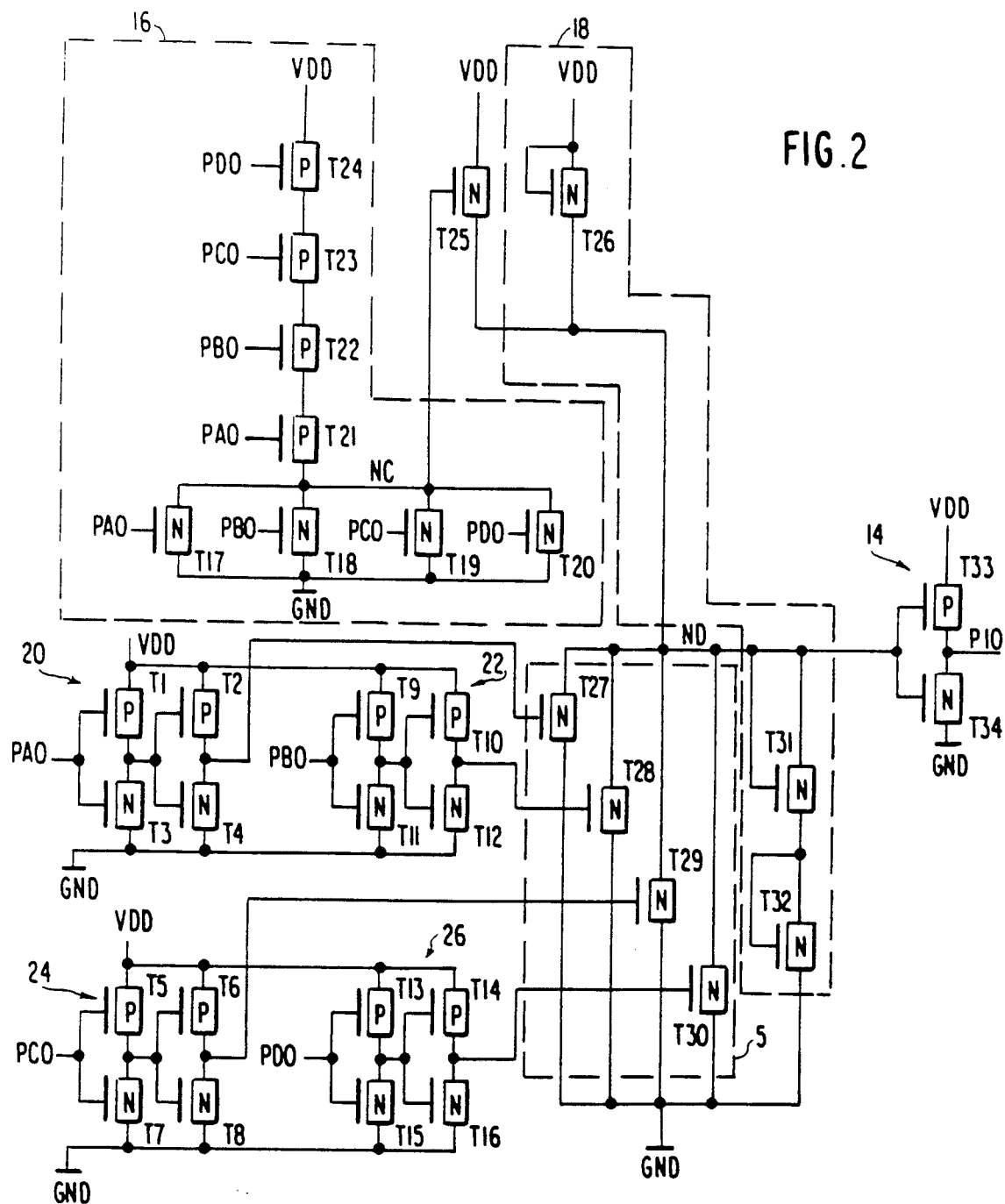
FIG. 2 is a schematic diagram of an embodiment of the invention.

FIG. 2 shows a specific embodiment which includes four input signals PA0, PB0, PC0 and PD0, and one functional OR-gate. In practice, there can be any number of inputs to the circuit. Since there only four different input signals and a single functional OR-gate, this specific embodiment can produce four different delay times through the circuit depending on which one of the input signals PA0, PB0, PC0 and PD0 is equal to "1".

The delay circuit of FIG. 2 which is the functional OR-gate (4,6,8,10,12) of FIG. 1 also includes a four-input NOR-gate 16, a pull-up transistor T25, a load circuit 18 and pull-down Transistors T27, T28, T29, T30, which comprise NOR 5, pulse-edge sharpening circuits 20, 22, 24 and 26 for signals PA0, PB0, PC0 and PD0, respectively, and the sense amplifier circuit 14.

The NOR-gate 16 includes four P-type MOS transistors T21–T24 connected in series between a supply voltage VDD and a node NC, as shown in FIG. 2. The gates of transistors T21–T24 receive the signals PA0–PD0, respectively. The NOR-gate 16 further includes four N-type MOS transistors T17–T20 connected in parallel between node NC and ground. The gates of transistors T17–T20 receive signals PA0–PD0, respectively.

The pull-up transistor T25 has its gate connected to node NC, its drain connected to a power supply VDD, and its source connected to a sensing node ND. As will be discussed below in connection with the operation of FIG. 2, this pull-up transistor T25 increases the operating speed of the circuit by resetting the output of the circuit during a RESET operation. Any one of a number of other means to perform this pull-up operation can be utilized.

The load or clamping circuit 18 for the NOR-gate 5 includes three N-type MOS transistors T26, T31 and T32. The gate and drain of transistor T26 is connected to a power supply VDD, and the source of transistor T26 is connected to a sensing node ND. Since the gate of transistor T26 is connected to the power supply VDD, this transistor will be always be biased for conduction (assuming the power supply voltage is greater than the threshold voltage of transistor T26). As a result, transistors T31 and T32 will also be biased for conduction, thereby causing the voltage at a sensing node ND set at a preset voltage $VND = \frac{2}{3} VDD$ if transistors T26, T31, and T32 are the same size. Clamping to some other voltage may be provided by varying the sizes of T26, T31, and T32 relative to each other.

The sense amplifier circuit 14 includes a P-type transistor T33 and an N-type transistor T34. These these transistors are connected to form a CMOS inverter. Each of the gates of transistors T33 and T34 is connected to the sensing node ND. The output P10 of circuit 14 is taken at the source/drain of transistor T33/T34.

The functional NOR-gate 5 includes four N-type MOS transistors (switching means) T27–T30. The drain of each of these transistors T27–T30 is connected to the sensing node ND, and the source of each of these transistors is connected to ground. The gates of transistors T27–T30 are connected to the outputs of circuits 20, 22, 24 and 26, respectively.

Each of pulse-sharpening circuits 20, 22, 24 and 26 includes two CMOS inverters connected in series. Circuit 20 includes P-type transistors T1 and T2 and N- type transistors T3 and T4. Circuit 22 includes P-type transistors T9 and T10, and N-type transistors T11 and T12. Circuit 24 includes P type transistors T5 and T6, and N-type transistors T7 and T8. Circuit 26 includes P-type transistors T13 and T14, and N-type transistors T15 and T16. Since each of the pulse-sharpening circuits 20, 22, 24 and 26 includes two CMOS inverters connected in series, the output of each of these circuits will be identical to its input. However, as is known in the art, by providing two CMOS inverters in series with each other, the output of these circuits will have much more sharply defined pulse edges relative to their input.

The operation of FIG. 2 will now be explained. More particularly, the operation of FIG. 2 will be explained in connection with the DATA and RESET cycles.

For the DATA cycle, assume that signal PA0 is equal to "1", and the remaining input signals PB0, PC0 and PD0 are each equal to "0". As a result, transistor T21 of the NOR circuit 16 would be rendered non-conductive, and the remaining P-type transistors of the NOR circuit T22-T24 would be rendered conductive. Further, transistor T17 would be rendered conductive and transistors T18-T20 would be rendered non-conductive. This would cause the voltage at node NC to be "0", thereby rendering pull-up transistor T25 non-conductive, since its gate is connected to node NC.

The gate of N-type transistor T26 is connected to the power supply, and therefore transistor T26, along with transistors T32 and T33, would be rendered conductive. Accordingly, a voltage will be established at node ND. In particular, the voltage at node ND would be VND because of the three conductive transistors T26, T31 and T32. Since the voltage at sensing node ND would be clamped at VND which is above the threshold voltages of transistors T33 and T34 of the drive out circuit 14, circuit 14 would output a LOW level signal for P10.

As indicated above, in this DATA cycle, PA0=1 and PB0=PC0=PD0=0. By supplying a "1" for input signal PA0, circuit 20 supplies to the gate of transistor T27 an output which would be a HIGH level signal, thereby causing transistor T27 to conduct. However, since each of the input signals for PB0, PC0 and PD0 is equal to "0, each of the N-type transistors T28-T30 would be non-conductive. When transistor T27 is rendered conductive, the voltage at node ND would be "pulled-down" or decreased as a new current is established from node ND to ground through transistor T27. When the voltage at node ND is pulled-down to a voltage level which is below the predetermined threshold voltages of transistors T33 and T34, transistor T34 would be rendered non-conductive, and transistor T33 would be rendered conductive, thereby "switching") the output P10 from a LOW level output to a HIGH level output.

Although in the specific example given above, where PA0=1 and PB0=PC0=PD0=0, it is apparent that if, for example, PB=1 and PA0=PCO=PDO=0, then transistor T28 would be rendered conductive and transistors T27, T29 and T30 would be rendered non-conductive. In this example, a new current path would be established from node ND to ground via transistor T28. As a result, the voltage at node ND would be pulled-down to a voltage level which is below the switching threshold of circuit 14, thereby switching it from a LOW level output to a HIGH level output. Similar results would occur if PCO=1 and PAO=PB0=PDO=0, or if PDO=1 and PAO=PBO=PCO=0.

As indicated in connection with FIG. 1, the functional NOR-gate 5 provides different delay or propagation times depending on which input terminal receives a "1". In FIG. 2, transistors T27-T30 correspond to terminals TO, +5, +1.0 and +1.5, respectively. More particularly, when PAO=1 and each of the remaining inputs is "0", the functional-NOR gate 5 has an associated delay of TO nanoseconds. Similarly, when PBO=1 and each of the remaining inputs is each equal to "0", then NOR gate 5 has an associated delay of (TO +0.5). Because of these differences in delay or propagation times, the voltage at node ND will be pulled-down or decreased at different rates depending on which one of transistors T27-30 is rendered conductive. As a result, the output P10 of circuit 14 will be switched from a LOW to a HIGH level at different relative times depending on which input signal receives a "1". Accordingly, different delay times for switching the output circuit 14 can be established in accordance with which input signal is equal to "1".

The different delay times for the input terminals of the functional-NOR gate 5 (i.e., the different delay times for transistors T27-T30) can be established during the manufacturing of the transistors by fixing different channel widths and lengths of the transistors. For example, transistor T27 would have a geometry such that its delay or propagation time would be TO, whereas transistor T30 would have a geometry such that its delay time would be (TO + 1.5). Equivalent or different delays can be achieved by simply turning on more than one pull-down transistor (i.e., T27, T28, T29, T30) at a time.

As indicated above, a RESET cycle occurs directly before and after a DATA cycle. A RESET cycle is established by setting each of the input signals equal to "0". When this occurs, a reset operation is initiated for each block, and whichever one of the transistors T27-T30 was rendered conductive would now be rendered non-conductive because a "0" would be supplied to its gate via the associated pulse-sharpening circuit. As a result, the voltage at the node would be pulled back up to VND, thereby switching the output of circuit 14 from a HIGH level to a LOW level. In order to speed up the pull-up operation of node ND, and thereby increase the operation of the circuit, the pull-up transistor T25 is provided. More particularly, the pull-up transistor T25 serves to quickly pull-up the voltage at node ND during the RESET operation.

A reset operation may occur without a reset cycle, by simply having PAO=PBO=PCO=PDO=0 for sufficient length of time. When PAO=PBO=PCO=P-DO=0, all of the transistors T21-T24 of NOR circuit 16 would be rendered conductive, thereby supplying a HIGH level signal at node NC. As a result of node NC being increased to a HIGH level, pull-up transistor T25 would be rendered conductive, thereby supplying current from its associated power supply to node ND. This would cause the voltage at node ND to be quickly pulled-up to a voltage level which is above the predetermined threshold voltage. When the voltage at node ND is above the threshold values of transistors T33 and T34 of circuit 14, circuit 14 would switch from a HIGH level output to a LOW level output for P10. The circuit would now be ready to receive another DATA cycle.

In the circuit of FIG. 2, it is preferable that the output P10 be provided with as much of a voltage swing (i.e., a voltage swing between a HIGH and a LOW voltage level) as possible, thereby to increase the accuracy of the circuit. In order to produce such swings, it is necessary to provide large enough voltage swings at node ND.

More particularly, when one of the transistors T27-T30 of FIG. 2 is rendered conductive, it is preferable that the voltage at node ND be pulled down to a level which is sufficiently below the predetermined threshold voltages of the transistors of circuit 14 so that variations in power supply, temperature and process tolerances will not affect the switching of circuit 14, whereby the accuracy of the circuit is improved In the embodiment shown in FIG. 2, when one of the transistors T27-T30 is rendered conductive, and therefore the voltage at node ND is pulled down, the current which is supplied from the N-type transistor T26 produces more current, as the voltage drop across transistor T26 increases. More particularly, transistor T26 will produce more current so as to maintain the voltage at the value before one of the transistors T27-T30 is rendered conductive. This increase in current from transistor T26 serves to resist the pull down of the voltage at node ND. Although the voltage at node ND will be pulled down to a voltage level which is below the predetermined threshold voltages of the transistors of circuit 14, the action of transistor T26 will tend to decrease the safety margin between the pulled-down voltage at node ND and the predetermined threshold voltages. As a result, power supply, temperature and process variations within the current may have an effect on the operation of sense amp circuit 14. More particularly, if the voltage at node ND is pulled-down to a voltage which is only slightly less than the switching threshold of circuit 14, then, for example, process variations within the circuit may prevent the voltage at node ND from decreasing to a voltage which is below the switching threshold, thereby causing circuit 14 to output an erroneous signal.

Figure 3:
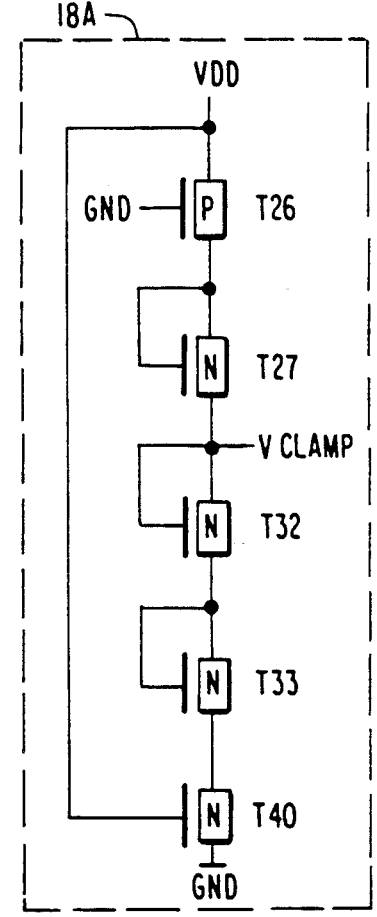
FIG. 3 is a schematic diagram of one embodiment of a load circuit which may be used in the present invention.

With this in mind, the clamp or load circuit 18a of FIG. 3 was developed, and includes a P-type MOS transistor T30 and N-type transistors T27, T32, T33 and T40. The P-type transistor T26 has its gate connected to ground, its source connected to a power supply VDD, and its drain connected to the source of transistor T27. The gate of transistor T40 is connected to the power supply VDD, and its source is connected to ground. Transistors T26 and T40 serve to limit current flow. The geometry of transistors T26 and T40 can be chosen so that the voltage drop across these transistors is a predetermined fraction of the voltage drops across the transistors T27, T32 and T33, thereby allowing flexibility to the circuit designer. This also allows optimization of the load characteristics, for example, when the clamp circuit is use for loading a switching device such as circuit 14 of FIG. 2. It should be noted that all of the transistors T33, T32 and T27 can be P-type MOS devices, N-type MOS devices or a combination of each, depending on the specific application of the clamp circuit, by simply reversing the gate polarity if a P-type MOS device is chosen.

Figure 4:
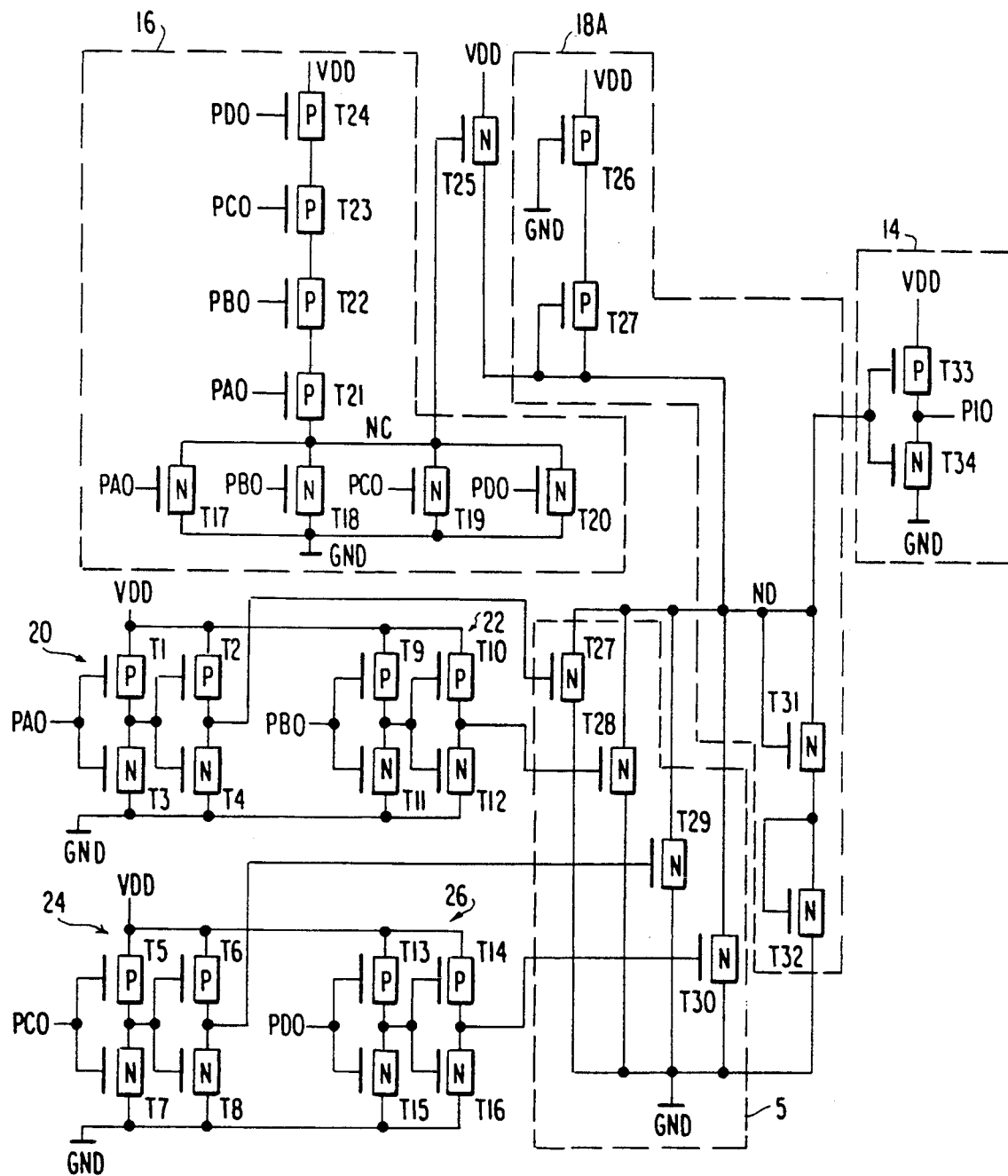
FIG. 4 is a schematic diagram of another embodiment of the delay circuit of the invention which includes the load circuit of FIG. 3.

FIG. 4 shows a further embodiment of the delay circuit including the clamp or load circuit 18A of FIG. 3. In all other respects, the circuit of FIG. 4 is identical to the circuit of FIG. 2. In FIG. 4, the transistor T40 of FIG. 3 is not necessary. Further, the transistor T27 of FIG. 3 is implemented in FIG. 4 as a P-type MOS device.

In FIG. 4, the load circuit 18A includes a P-type transistor T26 having its gate connected to ground, a P-type transistor T27 implemented as a diode, and the N-type transistors T31 and T32 of FIG. 2. By providing the P-type transistor T26, when the voltage at node ND decreases as a result of one of the N-type transistors T27-T30 being rendered conductive, the current which is supplied to node ND is not increased as in the embodiment of FIG. 2, thereby facilitating the pull down of node ND. More particularly, unlike the embodiment of FIG. 2, the current in transistor T26 does not increase as the node ND is pulled down. As a result, when the voltage at node ND is pulled-down to below the predetermined threshold voltages of the transistors of circuit 14 (i.e., is pulled-down when one of the transistors T27-T30 is rendered conductive), the pulled-down voltage at node ND is well below the switching threshold, thereby providing a greater tolerance or safety factor for any temperature, power supply or process variations within the circuit. Since the circuit will not be as affected by such variations, more precise delay times can be established.

What is claimed is:

1. A delay circuit for receiving a plurality of input signals, comprising:

output means, coupled to a node, for producing a first output when a voltage at the node is greater than or equal to a predetermined threshold voltage, and for producing a second output, which is different from the first output, when the voltage at the node is less than the predetermined voltage;

means for maintaining the voltage at the node greater than the predetermined threshold voltage, thereby causing said output means to produce the first output;

a plurality of switching means, and a plurality of pulse-sharpening circuits, each of said plurality of pulse-sharpening circuits being associated with a different one of said switching means, and each of said pulsesharpening circuits receiving a different one of the plurality of input signals, and supplying a pulse sharpened data input signal to a different one of said switching means, each of said switching means being rendered conductive when receiving a predetermined level of its associated pulse-sharpened data input signal to cause the voltage at the node to decrease to a voltage which is less than the predetermined threshold voltage, thereby causing the output means to produce the second output;

wherein at least one of the plurality of switching means is constructed such that, when the at least one switching means is rendered conductive, the rate at which the voltage at the node decreases is different form the rate at which the voltage at the node decreases when any of the other switching means is rendered conductive.

2. The delay circuit of claim 1, wherein each of said plurality of pulse-sharpening circuits comprises a pair of CMOS inverters connected in series with each other.

3. A delay circuit for receiving a plurality of input signals, comprising:

output means, coupled to a node, for producing a first output when a voltage at the node is greater than or equal to a predetermined threshold voltage, and for producing a second output, which is different from the first output, when the voltage at the node is less than the predetermined voltage;

means for maintaining the voltage at the node greater than the predetermined threshold voltage, thereby causing said output means to produce the first output; and a plurality of switching means, each of said switching means receiving a different one of the plurality of input signals, each of the switching means being rendered conductive, when receiving a predetermined level of its associated input signal, to cause the voltage at the node to decrease to a voltage which is less than the predetermined threshold voltage, thereby causing the output means to produce the second output;

wherein at least one of the plurality of switching means is constructed such that, when the at least one switching means is rendered conductive, the rate at which the voltage at the node decreases is different from the rate at which the voltage at the node decreases when any of the other switching means is rendered conductive, wherein said plurality of switching means comprises a plurality of N-type MOS devices, and wherein at least one of said N-type MOS devices has a different geometry from any of the other N-type MOS devices.

4. The delay circuit of claim 3, wherein said maintaining means is a clamp circuit.

5. The delay circuit of claim 4, wherein the clamp circuit comprises a plurality of N-type MOS devices and a power supply device, and wherein at least one of said N-type MOS devices is coupled to the node.

6. The delay circuit of claim 5, wherein said N-type MOS devices are transistors, and wherein one of said transistors has its gate and drain connected to the power supply, and has its source connected to the node.

7. The delay circuit of claim 4, wherein said clamp circuit comprises a plurality of P- and N-type MOS devices.

8. The delay circuit of claim 7, wherein the clamp circuit comprises first and second P-type MOS transistors and a plurality of N-type MOS transistors, said first P-type MOS transistor has its source connected to a power supply, its gate connected to ground, and its drain connected to the source of said second P-type MOS transistor, and wherein said second P-type MOS transistor has its gate and its drain connected to the node.

9. A delay circuit for receiving a plurality of input signals, comprising:

output means, coupled to a node, for producing a first output when a voltage at the node is greater than or equal to a predetermined threshold voltage, and for producing a second output, which is different from the first output, when the voltage at the node is less than the predetermined voltage;

means for maintaining the voltage at the node greater than the predetermined threshold voltage, thereby causing said output means to produce the first output; and a plurality of switching means, each of said switching means receiving a different one of the plurality of input signals, each of the switching means being rendered conductive, when receiving a predetermined level of its associated input signal, to cause the voltage at the node to decrease to a voltage which is less than the predetermined threshold voltage, thereby causing the output means to produce the second output; and means for increasing the voltage at the node, said increasing means being operable only when one of the plurality of switching means is rendered conductive;

wherein at least one of the plurality of switching means is constructed such that, when the at least one switching means is rendered conductive, the rate at which the voltage at the node decreases is different from the rate at which the voltage at the node decreases when any of the other switching means is rendered conductive.

10. The delay circuit of claim 9, further comprising a multi-input NOR circuit for receiving the plurality of input signals, and wherein said increasing means comprises an N-type MOS transistor having its drain connected to a power supply, its source connected to the node, and having its gate connected to the output of said NOR circuit.

11. A delay circuit for receiving a plurality of input signals, comprising:

output means, coupled to a node, for producing a first output when a voltage at the node is greater than or equal to a predetermined threshold voltage, and for producing a second output, which is different form the first output, when the voltage at the node is less than the predetermined voltage;

means for maintaining the voltage at the node greater than the predetermined threshold voltage, thereby causing said output means to produce the first output; and a plurality of switching means, each of said switching means receiving a different one of the plurality of input signals, each of the switching means being rendered conductive, when receiving a predetermined level of its associated input signal, to cause the voltage at the node to decrease to a voltage which is less than the predetermined threshold voltage, thereby causing the output means to produce the second output;

wherein at least one of the plurality of switching means is constructed such that, when the at least one switching means is rendered conductive, the rate at which the voltage at the node decreases is different from the rate at which the voltage at the node decreases when any of the other switching means is rendered conductive, and wherein said output means comprises a CMOS invertor having its input connected to the node.

* * * * *

UNITED STATES PATENT AND TRADEMARK OFFICE
CERTIFICATE OF CORRECTION

PATENT NO. : 5,059,837
DATED : October 22, 1991
INVENTOR(S) : Charles K. Erdelyi and Mark G. Marshall It is certified that error appears in the above-indentified patent and that said Letters Patent is hereby corrected as shown below:

On the title page, item [75] Inventors: add the following after "Vt."
on the second line: --; John W. Mathews, Burlington, Vt.; Patrick E. Perry,
Colchester, Vt.--.

Signed and Sealed this

Twentieth Day of July, 1993

Attest:

MICHAEL K. KIRK

Attesting Officer

Acting Commissioner of Patents and Trademarks